(12) United States Patent  
Kim et al.

(10) Patent No.: US 12,206,045 B2  
(45) Date of Patent: Jan. 21, 2025

(54) LIGHT EMITTING DEVICE AND MANUFACTURING METHOD THEREOF

(71) Applicant: SAMSUNG ELECTRONICS CO., LTD., Suwon-si (KR)

(72) Inventors: Dongho Kim, Bucheon-si (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 306 days.

(21) Appl. No.: 17/477,810

(22) Filed: Sep. 17, 2021

(65) Prior Publication Data

US 2022/0246796 A1    Aug. 4, 2022

Related U.S. Application Data

(60) Provisional application No. 63/145,170, filed on Feb. 3, 2021.

(30) Foreign Application Priority Data

Apr. 29, 2021    (KR) .................. 10-2021-0055950

(51) Int. Cl.
*H01L 33/10*    (2010.01)
*H01L 25/075*    (2006.01)
(Continued)

(52) U.S. Cl.
CPC .......... *H01L 33/12* (2013.01); *H01L 25/0753* (2013.01); *H01L 33/0075* (2013.01);
(Continued)

(58) Field of Classification Search
CPC ............ H01L 25/0753; H01L 33/0075; H01L 33/0095; H01L 33/04; H01L 33/10;
(Continued)

(56) References Cited

U.S. PATENT DOCUMENTS

| 9,349,918 B2 | 5/2016 | Kashima et al. |
| 2009/0286339 A1 | 11/2009 | Im |

(Continued)

FOREIGN PATENT DOCUMENTS

| CN | 110943113 A | 3/2020 |
| KR | 101034053 B1 * | 5/2011 |

(Continued)

OTHER PUBLICATIONS

Schubert, " Light-Emitting Diodes," Second Edition, Cambridge, 2006, Total 434 pages.

(Continued)

*Primary Examiner* — Matthew C Landau
*Assistant Examiner* — Dmitriy Yemelyanov
(74) *Attorney, Agent, or Firm* — Sughrue Mion, PLLC

(57) ABSTRACT

Provided is a light emitting device including a buffer layer, a body provided on the buffer layer, the body including a first semiconductor layer, an active layer, and a second semiconductor layer, a reflective layer configured to reflect light incident from the active layer, and a scattering pattern provided between the first semiconductor layer and the buffer layer, the scattering pattern being configured to scatter the light incident from the active layer and light incident from the reflective layer.

11 Claims, 23 Drawing Sheets

(51) Int. Cl.
 *H01L 33/00* (2010.01)
 *H01L 33/04* (2010.01)
 *H01L 33/12* (2010.01)
 *H01L 33/32* (2010.01)
(52) U.S. Cl.
 CPC .......... *H01L 33/0095* (2013.01); *H01L 33/04* (2013.01); *H01L 33/10* (2013.01); *H01L 33/32* (2013.01)
(58) Field of Classification Search
 CPC ......... H01L 33/12; H01L 33/22; H01L 33/32; H01L 33/46
 See application file for complete search history.

(56) References Cited

U.S. PATENT DOCUMENTS

| | | | | |
|---|---|---|---|---|
| 2010/0163906 | A1* | 7/2010 | Hong | H01L 33/20 |
| | | | | 257/E33.068 |
| 2012/0068214 | A1* | 3/2012 | Kuo | H01L 21/0237 |
| | | | | 257/E33.068 |
| 2012/0138980 | A1* | 6/2012 | Kuo | H01L 33/007 |
| | | | | 977/932 |
| 2014/0167066 | A1* | 6/2014 | Kashima | H01L 22/12 |
| | | | | 257/98 |
| 2017/0309604 | A1* | 10/2017 | Kim | H01L 25/167 |
| 2018/0248076 | A1 | 8/2018 | Suzaki et al. | |
| 2022/0123269 | A1 | 4/2022 | An et al. | |

FOREIGN PATENT DOCUMENTS

| | | |
|---|---|---|
| KR | 10-2020-0127103 A | 11/2020 |
| WO | 2017/014100 A1 | 1/2017 |

OTHER PUBLICATIONS

Huang et al., "Enhanced Light Extraction Efficiency of GaN-Based Hybrid Nanorods Light-Emitting Diodes," IEEE Journal of Selected Topics in Quantum Electronics, vol. 21, No. 4, Jul./Aug. 2015, Total 7 pages.

* cited by examiner

LIGHT EMITTING DEVICE AND MANUFACTURING METHOD THEREOF

CROSS-REFERENCE TO RELATED APPLICATIONS

This application claims the benefit of U.S. Provisional Application No. 63/145,170, filed on Feb. 3, 2021, in the United States Patent and Trademark Office, and Korean Patent Application No. 10-2021-0055950, filed on Apr. 29, 2021, in the Korean Intellectual Property Office, the disclosures of which are incorporated herein in their entireties by reference.

BACKGROUND

1. Field

Example embodiments of the present disclosure relate to light emitting devices and methods of manufacturing the same, and more particularly, to a light emitting device having high efficiency in terms of light extraction and a method of manufacturing the same.

2. Description of Related Art

Recently, semiconductor-based light emitting diodes (LED) have been put to practical use in various industrial fields such as display fields due to high luminous efficiency and long lifespan.

Materials constituting an LED may have a high refractive index, such that light emitted from the LED cannot escape from the LED due to a total reflection phenomenon that occurs when light exits from a medium having a high refractive index to a medium having a low refractive index, for example, air. Due to these limitations, the need for LEDs having high light extraction efficiency has emerged.

SUMMARY

One or more example embodiments provide light emitting devices having improved light extraction efficiency and methods of manufacturing the same.

Additional aspects will be set forth in part in the description which follows and, in part, will be apparent from the description, or may be learned by practice of example embodiments of the disclosure.

According to an aspect of an example embodiment, there is provided a light emitting device including a buffer layer, a body provided on the buffer layer, the body including a first semiconductor layer, an active layer, and a second semiconductor layer, a reflective layer configured to reflect light incident from the active layer, and a scattering pattern provided between the first semiconductor layer and the buffer layer, the scattering pattern being configured to scatter the light incident from the active layer and light incident from the reflective layer.

The scattering pattern may include a plurality of scattering elements protruding from the buffer layer to the first semiconductor layer, and the scattering pattern may be in direct contact with the buffer layer and the first semiconductor layer.

The scattering pattern may have a mesh structure including a plurality of holes, and a cross-section of each of the holes may have one of a circular shape, an elliptical shape, or a polygonal shape.

The light emitting device may further include a plurality of cavities provided between the scattering pattern and the buffer layer, the cavities containing air.

The light emitting device may further include at least one void provided between the scattering pattern and the first semiconductor layer, the at least one void containing air.

The scattering pattern may include a dielectric material having a permittivity of 4 or less.

The scattering pattern may include at least one of aluminum oxide ($Al_2O_3$), silicon oxide ($SiO_2$), silicon nitride ($Si_3N_4$), titanium oxide ($TiO_2$), magnesium oxide (MgO), magnesium fluoride ($MgF_2$), stannic oxide ($SnO_2$), tantalum dioxide ($TaO_2$), zinc sulfide (ZnS), or ceric oxide ($CeO_2$).

A period of the scattering pattern may be 0.1 µm to 10 µm.

A thickness of the scattering pattern may be 10 nm to 1 µm.

The scattering pattern may include a crystallized material.

One of the first semiconductor layer and the second semiconductor layer may be a p-type semiconductor layer, and the other of the first semiconductor layer and the second semiconductor layer may be an n-type semiconductor layer.

The active layer may have a multi-quantum well (MQW) structure, and the active layer may include a quantum barrier layer including gallium nitride (GaN) and a quantum well layer including $In_xGa_{1-x}N$ ($0 \leq x \leq 1$).

The reflective layer may include at least one of gold (Au), silver (Ag), or aluminum (Al).

The buffer layer may include aluminum nitride (AlN).

According to another aspect of an example embodiment, there is provided a method of manufacturing a light emitting device, the method including growing a buffer layer on a substrate, forming a scattering pattern on the buffer layer, growing a first semiconductor layer, an active layer, and a second semiconductor layer on the scattering pattern, forming a reflective layer on the second semiconductor layer, and removing the substrate through potassium hydroxide (KOH) wet etching, wherein the scattering pattern is provided in the first semiconductor layer.

The forming of the scattering pattern may include depositing a scattering material layer on the buffer layer, forming a photoresist pattern on the scattering material layer, etching a portion of the scattering material layer not covered with the photoresist pattern, and removing the photoresist pattern.

The forming of the scattering pattern may include forming a photoresist pattern on the buffer layer, depositing a scattering material layer on the buffer layer to form a scattering pattern, removing the photoresist pattern, and annealing the scattering pattern.

According to another aspect of an example embodiment, there is provided a display device including a display layer including a plurality of light emitting devices, and a driving layer including a plurality of transistors electrically connected to the plurality of light emitting devices, respectively, and the driving layer being configured to drive the plurality of light emitting devices, wherein at least one of the plurality of light emitting devices includes a buffer layer, a body provided on the buffer layer, the body including a first semiconductor layer, an active layer, and a second semiconductor layer, a reflective layer configured to reflect light incident from the active layer, and a scattering pattern is provided between the first semiconductor layer and the buffer layer, the scattering pattern being configured to scatter the light incident from the active layer and light reflected from the reflective layer.

The scattering pattern may have a mesh structure including a plurality of holes, and a cross-section of each of the holes may have one of a circular shape, an elliptical shape, or a polygonal shape.

At least one of the plurality of light emitting devices may include a plurality of cavities provided between the scattering pattern and the buffer layer, the plurality of cavities containing air.

According to another aspect of an example embodiment, there is provided a light emitting device including a buffer layer, a body provided on the buffer layer, the body including a first semiconductor layer, an active layer, and a second semiconductor layer, a reflective layer provided on the body opposite to the buffer layer, the reflective layer being configured to reflect light incident from the active layer, and a scattering pattern included in the first semiconductor layer, the scattering pattern being configured to scatter the light incident from the active layer and light incident from the reflective layer.

BRIEF DESCRIPTION OF THE DRAWINGS

The above and/or other aspects, features, and advantages of example embodiments of the disclosure will be more apparent from the following description taken in conjunction with the accompanying drawings, in which.

DETAILED DESCRIPTION

Figure 1:
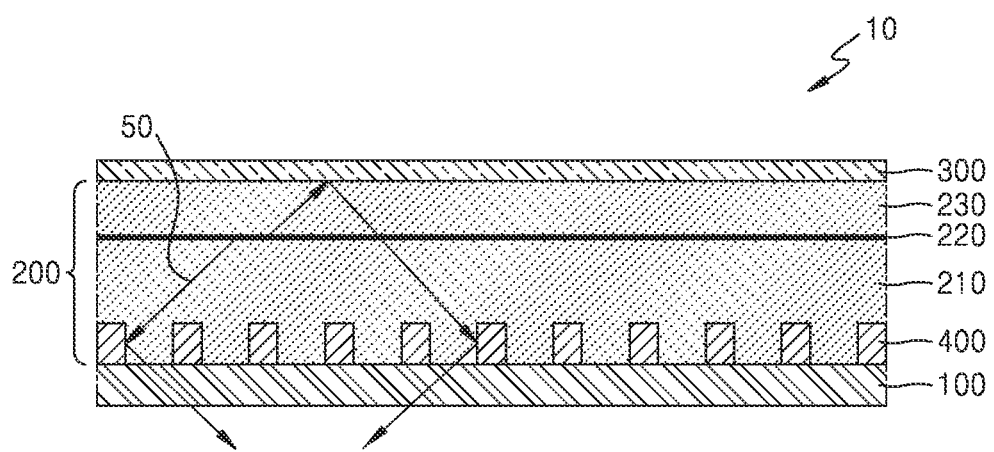
FIG. 1 is a cross-sectional view of a light emitting device according to an example embodiment.

Reference will now be made in detail to example embodiments of which are illustrated in the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. The example embodiments described herein are merely examples, and various modifications may be made from these embodiments. In the following drawings, like reference numerals refer to like components, and the size of each component in the drawings may be exaggerated for clarity and convenience of description.

Hereinafter, when it is described that a certain component is "above" or "on" another component, the certain component may be directly above another component, or a third component may be interposed therebetween.

The singular expressions include plural expressions unless the context clearly dictates otherwise. When a part "includes" a component, it may indicate that the part does not exclude another component but may further include another component, unless otherwise stated.

The use of the terms "a" and "an" and "the" and similar referents may cover both the singular and the plural.

The meaning of "connection" may include a physical connection as well as an optical connection.

The use of any and all examples, or exemplary language (e.g., "such as") provided herein, is intended merely to better illustrate the inventive concept and does not pose a limitation on the scope of the inventive concept unless otherwise claimed.

Terms such as first, second, etc., may be used to describe various components, but the components should not be limited by these terms. The terms are used only for the purpose of distinguishing one component from another.

Figure 2:
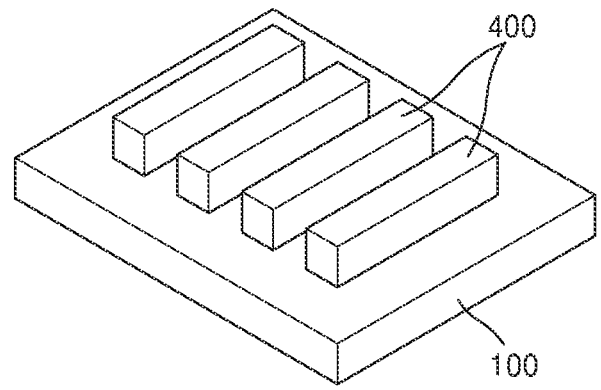
FIG. 2 is a three-dimensional (3D) view of a buffer layer and a scattering pattern of the light emitting device according to an example embodiment.
Figure 3:
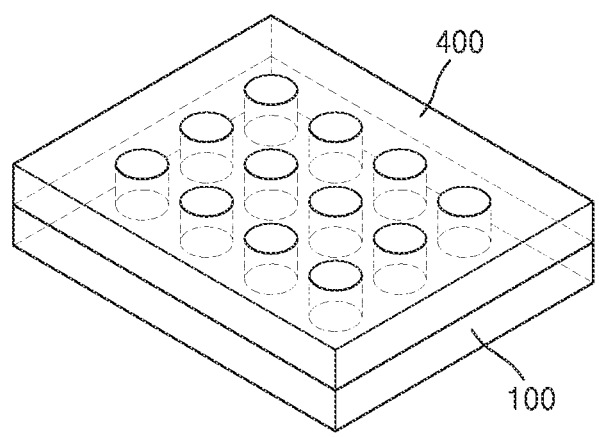
FIG. 3 is a view illustrating that a scattering pattern according to an example embodiment has a mesh structure including holes having a circular cross-section on the buffer layer.
Figure 4:
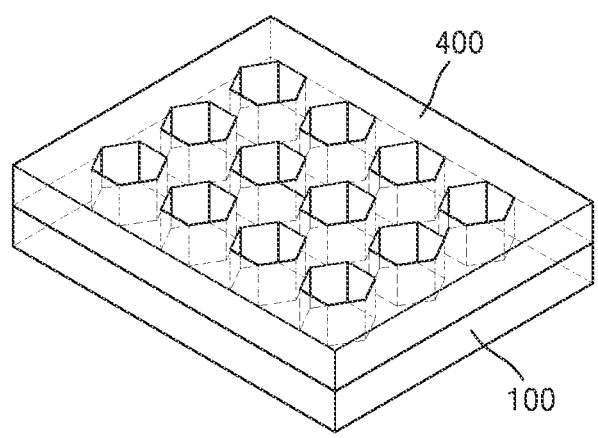
FIG. 4 is a view illustrating that a scattering pattern according to an example embodiment has a mesh structure including holes having a hexagonal cross-section on the buffer layer.

FIG. 1 is a cross-sectional view of a light emitting device 10 according to an example embodiment, FIG. 2 is a three-dimensional (3D) view of a buffer layer 100 and a scattering pattern 400 of the light emitting device 10 according to an example embodiment, FIG. 3 is a view illustrating that the scattering pattern 400 according to an example embodiment has a mesh structure including holes having a circular cross-section on the buffer layer 100, and FIG. 4 is a view illustrating that the scattering pattern 400 according to an example embodiment has a mesh structure including holes having a hexagonal cross-section on the buffer layer 100.

Referring to FIG. 1, the light emitting device 10 according to an example embodiment may include the buffer layer 100, a body 200 disposed on the buffer layer 100 and including a first semiconductor layer 210, an active layer 220, and a second semiconductor layer 230, a reflective layer 300 disposed on the body 200 and configured to reflect light 50 incident from the active layer 220, and the scattering pattern 400 embedded in the first semiconductor layer 210 on the buffer layer 100 and scattering the light 50 incident from the active layer 220 or the reflective layer 300.

The buffer layer 100 may be positioned on a substrate, and after the buffer layer 100 is positioned, the substrate may be removed. The buffer layer 100 may be required to grow the body 200 or the first and second semiconductor layers 210 and 230 and the active layer 220 of the body 200. For example, a material suitable for epitaxial growth of gallium nitride (GaN) having a hexagonal wurtzite structure may be selected as the buffer layer 100, however, embodiments are not limited thereto. For example, the buffer layer 100 may include aluminum nitride (AlN) having a hexagonal wurtzite structure.

The scattering pattern 400 may be provided on an upper surface of the buffer layer 100 and may be provided in the first semiconductor layer 210. For example, a surface of the scattering pattern 400 may contact the buffer layer 100 and the other surfaces of the scattering pattern 400 may contact and be embedded in the first semiconductor layer 210. For example, the scattering pattern 400 may include a plurality of scattering elements protruding from the buffer layer 100 to the first semiconductor layer 210, and FIG. 1 illustrates that the scattering elements have a stripe shape. However, embodiments are not limited thereto. For example, the scattering pattern 400 on the buffer layer 100 may have a structure having a plurality of holes, and a cross-section of the holes may have one of various shapes such as a circular, elliptical, or polygonal shape. The scattering pattern 400 and the first semiconductor layer 210 may appear to be alternately arranged on the cross-sectional view according to the former and the latter examples.

The scattering pattern 400 may have a period. For example, when the scattering pattern 400 includes the scattering elements, the period of the scattering pattern 400 may refer to the scattering elements being arranged on the buffer layer 100 at a constant period. In the case of the scattering pattern 400 having the mesh structure including holes, the period of the scattering pattern 400 may refer to the holes being arranged at a constant period. When the scattering pattern 400 includes the scattering elements, the buffer layer 100 may be exposed between adjacent scattering elements. In the case of the scattering pattern 400 having the mesh structure including holes, the entire upper surface of the buffer layer 100 may not be covered by the scattering pattern 400 due to the holes, and the buffer layer 100 may be exposed. The body 200 may be epitaxially grown on the buffer layer 100 not covered by the scattering pattern 400 and exposed.

Referring to FIGS. 1 and 2, the scattering pattern 400 is arranged on the buffer layer 100 in the stripe shape, but embodiments are not limited thereto and the scattering pattern 400 may be arranged in various shapes. For example, the scattering pattern 400 may have a mesh structure including holes. Here, the cross-section of the holes may have various shapes such as a circular, elliptical, or polygonal shape. For example, the period between the scattering patterns 400 may be about 0.1 μm to about 10 μm. For example, a thickness of the scattering pattern 400 may be about 10 nm to about 1 μm. The thickness of the scattering pattern 400 may be less than a wavelength of the light 50. The shape of the scattering pattern 400, the period of the scattering pattern 400, and the thickness of the scattering pattern 400 may be appropriately selected considering light extraction efficiency of an LED to be manufactured. For example, if gallium nitride (GaN) having a hexagonal wurtzite structure is grown on the buffer layer 100, the scattering pattern 400 may have a mesh structure including holes having the hexagonal cross-section.

Referring to FIG. 2, the scattering pattern 400 according to an example embodiment may have the stripe shape. A plurality of scattering patterns 400 in the form of stripes may be arranged to have a predetermined period, and the first semiconductor layer 210 of the body 200 may be alternately positioned thereon. A portion of the first semiconductor layer 210 may be in contact with the scattering patterns 400, and the scattering patterns 400 may be embedded in the first semiconductor layer 210.

Referring to FIG. 3, the scattering pattern 400 according to an example embodiment may have a mesh structure including holes having a circular cross-section on the buffer layer 100. The first semiconductor layer 210 of the body 200 may be positioned inside the holes having the circular cross-section of the scattering pattern 400 and on the scattering pattern 400. A portion of the first semiconductor layer 210 may be in contact with the scattering pattern 400, and the scattering pattern 400 may be embedded in the first semiconductor layer 210.

Referring to FIG. 4, the scattering pattern 400 according to an example embodiment may have a mesh structure including holes having a hexagonal cross-section on the buffer layer 100. The first semiconductor layer 210 of the body 200 may be positioned inside the holes having the hexagonal cross-section of the scattering pattern 400 and on the scattering pattern 400. A portion of the first semiconductor layer may be in contact with the scattering pattern 400, and the scattering pattern 400 may be embedded in the first semiconductor layer 210.

Figure 5:
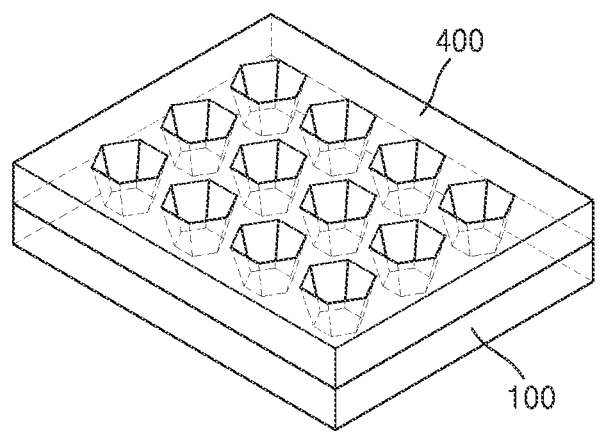
FIG. 5 is a view illustrating that holes having a hexagonal cross-section of a scattering pattern according to an example embodiment change in width according to thickness.

FIG. 5 is a view illustrating that a width of the holes having the hexagonal cross-section of the scattering pattern 400 changes in the thickness direction according to an example embodiment.

The holes of the scattering pattern 400 according to an example embodiment are illustrated to have a cross-section having a constant size according to the thickness on the buffer layer 100, but embodiments are not limited thereto and a size of the cross-section of the hole of the scattering pattern 400 may change along a thickness direction toward the buffer layer 100. Referring to FIG. 5, the scattering pattern 400 according to an example embodiment may have a mesh structure having holes having a hexagonal cross-sectional area that changes along a thickness direction toward the buffer layer 100. An angle between a side surface of the scattering pattern 400 and the buffer layer 100 may be appropriately selected so that the light 50 emitted from the active layer 220 may escape and be emitted external to the light emitting device 10 without total reflection. Although FIG. 5 shows that the width of the cross-section of the holes increases in a direction away from the buffer layer 100, embodiments are not limited thereto and the width of the cross-section of the holes may gradually decrease away from the buffer layer 100 or an increase and decrease of the width of the scattering pattern 400 may be repeated.

Without the scattering pattern 400, when the light 50 emitted from the active layer 220 of the body 200 is incident on the air, where the refractive index of air $n_{air}=1$, if an incident angle of the light is greater than a critical angle, the light 50 is totally reflected and only the light 50 having an incident angle less than the critical angle escapes from the light emitting device 10. If both sides of the body 200 are parallel, the light 50 having an incident angle greater than the critical angle may continue to be totally reflected between both sides of the body 200 and may be trapped inside the body 200 or may be reabsorbed by the active layer 220. Accordingly, the light extraction efficiency of the light emitting device 10 may be lowered.

The scattering pattern 400 may scatter the light 50 emitted from the active layer 220. In particular, if the thickness of the scattering pattern 400 is not less or sufficiently greater than a wavelength of light, it may be difficult to ignore scattering such as Rayleigh scattering and Mie scattering. The scattering pattern 400 may have a refractive index lower than that of the first semiconductor layer 210 and may include a light-transmissive material. For example, the refractive index of the first semiconductor layer 210 may have a value of 2 or greater, and the refractive index of the scattering pattern 400 may have a value of about 2 or less. However, embodiments are not limited thereto. For example, a permittivity of the scattering pattern 400 may have a value of about 4 or less. The scattering pattern 400 may scatter the light 50 emitted from the active layer 220, so that the light 50, which may be totally reflected without the scattering pattern 400, may be discharged out of the light emitting device 10. Therefore, the light extraction efficiency of the light emitting device 10 may be improved using the scattering pattern 400. The scattering pattern 400 may include, for example, at least one of dielectrics such as aluminum oxide ($Al_2O_3$), a silicon oxide film ($SiO_2$), silicon nitride ($Si_3N_4$), titanium oxide ($TiO_2$), magnesium oxide (MgO), magnesium fluoride ($MgF_2$), stannic oxide ($SnO_2$), tantalum dioxide ($TaO_2$), zinc sulfide (ZnS), ceric oxide ($CeO_2$), etc.

The body 200 may include the first semiconductor layer 210, the active layer 220, and the second semiconductor layer 230, and may be grown on the buffer layer 100 in this order. A lower portion of the first semiconductor layer 210 may be in contact with a portion of the buffer layer 100, and a portion thereof not in contact with the buffer layer 100 may be in contact with the scattering pattern 400. Because the scattering pattern 400 is positioned on the buffer layer 100 and the body 200 is grown on the buffer layer 100, the scattering pattern 400 may be embedded in the first semiconductor layer 210 of the body 200. However, the body 200 is not limited to being grown on the buffer layer 100, and may also be grown on the scattering pattern 400 that has undergone an annealing process.

The first semiconductor layer 210 and the second semiconductor layer 230 may include a group II-VI or group III-V compound semiconductor material. The first semiconductor layer 210 and the second semiconductor layer 230 may provide electrons and holes to the active layer 220. To this end, the first semiconductor layer 210 may be doped n-type or p-type, and the second semiconductor layer 230 may be doped with a conductivity type electrically opposite to that of the first semiconductor layer 210. For example, the first semiconductor layer 210 may be doped p-type and the second semiconductor layer 230 may be doped n-type, or the first semiconductor layer 210 may be doped n-type and the second semiconductor layer 210 may be doped n-type. In the case of doping the second semiconductor layer 230 n-type, for example, silicon (Si) may be used as a dopant, and in the case of doping the first semiconductor layer 210 as a p-type, for example, zinc (Zn) may be used as a dopant. Here, the second semiconductor layer 230 doped as an n-type may provide electrons to the active layer 220, and the first semiconductor layer 210 doped as a p-type may provide holes to the active layer 220.

The active layer 220 has a quantum well structure in which quantum wells are provided between barriers. As electrons and holes provided from the first semiconductor layer 210 and the second semiconductor layer 230 may recombine within the quantum well structure in the active layer 220, and the light 50 may be emitted. A wavelength of light generated in the active layer 220 may be determined according to a band gap of a material constituting the quantum wells in the active layer 220. The active layer 220 may have a single quantum well structure, or a multi-quantum well (MQW) structure in which multiple quantum wells and a plurality of barriers are alternately positioned. A thickness of the active layer 220 or the number of quantum wells in the active layer 220 may be appropriately selected considering a driving voltage and luminous efficiency of the light emitting device 10 to be manufactured.

The active layer 220 may include a quantum barrier layer and a quantum well layer. For example, the quantum barrier layer may include gallium nitride (GaN), and the quantum well layer may include indium gallium nitride ($In_xGa_{1-x}N$ ($0 \le x \le 1$)). The quantum barrier layer or quantum well layer may include various materials, without being limited to the above example. The active layer 220 may have a structure in which the quantum barrier layers and the quantum well layers are alternately stacked N times, where, N is a natural number greater than or equal to 1.

The reflective layer 300 may reflect the light 50 emitted upward from the active layer 220 downward. Due to the reflective layer 300, the light emitting device 10 may have a bottom emission structure. As the light 50 emitted upward is reflected downward by the reflective layer 300, the light extraction efficiency of the bottom emission structure may be improved. In addition, the reflective layer 300 may serve as an upper electrode on the body 200. The reflective layer 300 may include, for example, a metal such as gold (Au), silver (Ag), or aluminum (Al) or an alloy thereof, or a multilayer structure thereof, in a visible light range.

Figure 6:
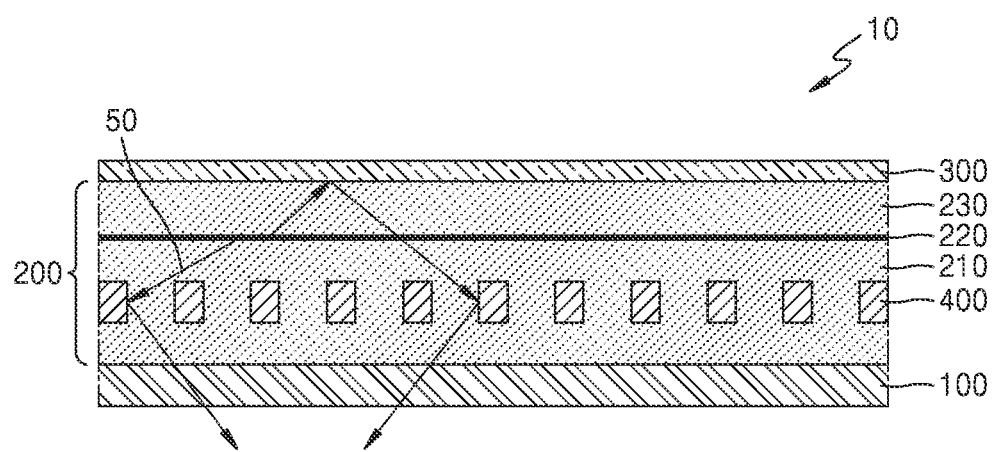
FIG. 6 is a cross-sectional view illustrating a light emitting device according to another example embodiment.

FIG. 6 is a cross-sectional view of the light emitting device 10 according to another example embodiment.

The light emitting device 10 according to the example embodiment of FIG. 1 shows that the scattering pattern 400 is positioned on the buffer layer 100 and is in contact with the buffer layer 100, and accordingly, apart from the one surface of the scattering pattern 400 being in contact with the buffer layer 100 the scattering pattern 400 is embedded in the first semiconductor layer 210. However, embodiments are not limited thereto, and all of the surfaces of the scattering pattern 400 may be embedded in the first semiconductor layer 210.

Referring to FIG. 6, in the light emitting device 10 according to an example embodiment, the scattering pattern 400 may be completely embedded in the first semiconductor layer 210 so that all of the surfaces of the scattering pattern 400 are in contact with the first semiconductor layer 210. Similarly, the example embodiments of FIGS. 2 to 5 may not be limited to the configuration in which the scattering pattern 400 is positioned on the buffer layer 100, and a portion of the first semiconductor layer 210 may be positioned on the buffer layer 100, but the scattering pattern 400 may be included in the first semiconductor layer 210, and the first semiconductor layer 210 may entirely cover the scattering pattern 400.

Figure 7:
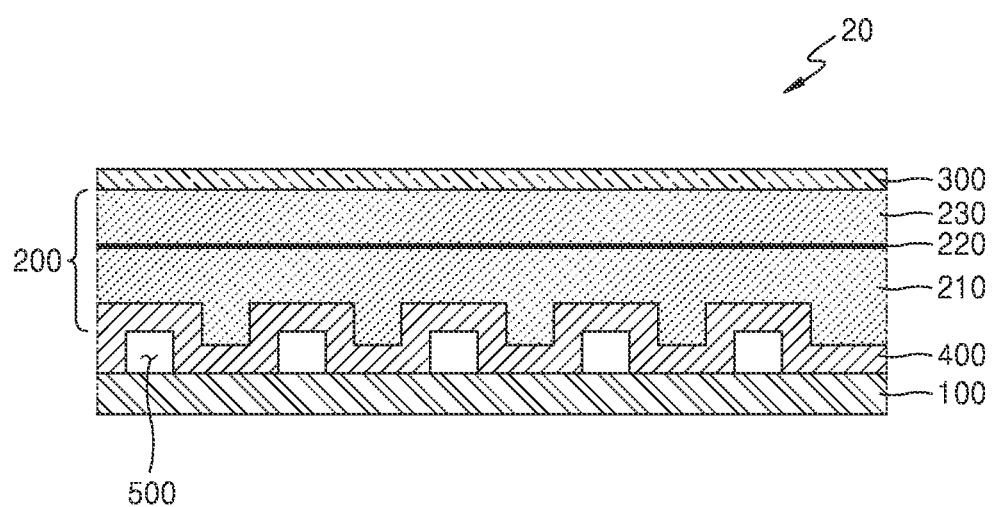
FIG. 7 is a cross-sectional view of a light emitting device according to another example embodiment.

FIG. 7 is a cross-sectional view of a light emitting device 20 according to another example embodiment.

Referring to FIG. 7, the light emitting device 20 according to an example embodiment may include a plurality of cavities 500 between the scattering pattern 400 and the buffer layer 100. The cavity 500 may contain, for example, air which has a refractive index of 1 and a permittivity of 1. Accordingly, a refractive index of the cavity 500 may be 1, and a permittivity of the cavity 500 may be approximately 1. Scattering of the light 50 emitted from the active layer 220 may take place more easily by the cavity 500, thereby increasing light extraction efficiency.

Referring to FIG. 7, the body 200 of the scattering pattern 400 according to an example embodiment may be grown on a surface of the scattering pattern 400, without contacting a surface of the buffer layer 100. In order for the body 200 to grow on the surface of the scattering pattern 400, the scattering pattern 400 according to an example embodiment may have undergone an annealing process, and a lower portion of the first semiconductor layer 210 may be in contact with the scattering pattern 400 that has undergone the annealing process. The scattering pattern 400 that has undergone the annealing process may include a crystallized material. The body 200 may be grown on the scattering pattern 400 that has undergone the annealing process, and the scattering pattern 400 may be partially embedded in the first semiconductor layer 210 of the body 200. For example, in the case of epitaxial growth of gallium nitride (GaN) having a hexagonal wurtzite crystal structure, the epitaxial growth may not be properly made on a scattering pattern 400 that has not been annealed. This is because a structure of the scattering pattern 400 that has not been annealed is not a hexagonal wurtzite crystal structure, but is in an amorphous state. Accordingly, the scattering pattern 400 including the crystallized material may be positioned by performing the annealing process to change a phase of the scattering pattern 400 in the amorphous state to a crystalline state. For example, when aluminum nitride (AlN) having the hexagonal wurtzite crystal structure is positioned under the scattering pattern 400, the scattering pattern 400 may also have the hexagonal wurtzite crystal structure through the annealing process. Gallium nitride (GaN) may be epitaxially grown on the scattering pattern 400 including the crystallized material.

Figure 8:
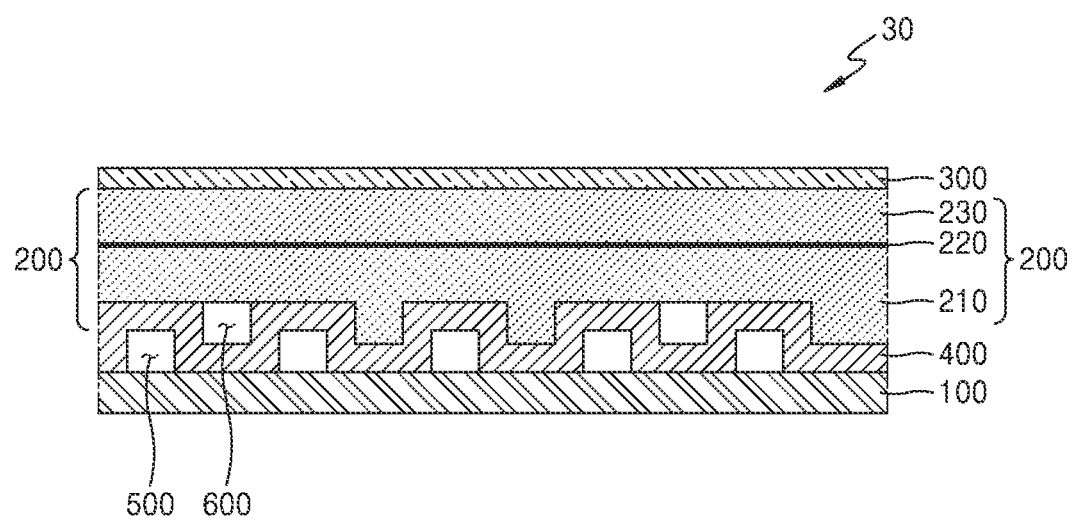
FIG. 8 is a cross-sectional view of a light emitting device according to another example embodiment.

FIG. 8 is a cross-sectional view of a light emitting device 30 according to another example embodiment.

Referring to FIG. 8, the light emitting device 30 may further include one or more voids 600 provided between the scattering pattern 400 and the first semiconductor layer 210 and containing air. The void 600 may be disposed between adjacent cavities 500 among the cavities 500. The void 600 may or may not be formed according to conditions of epitaxial growth. The void 600 may also contain air similar to the cavity 500, and accordingly, a refractive index of the void 600 may be 1, and a permittivity of the void 600 may be approximately 1. In the light emitting device 30 including the void 600, scattering of the light 50 may take place more easily, and thus, light extraction efficiency may be increased. Conditions for epitaxial growth may be appropriately selected so that the voids 600 may be more easily formed. However, instead of epitaxially growing the body 200 on the scattering pattern 400 subjected to the annealing process as shown in FIGS. 7 and 8, in the case of epitaxially growing the body 200 on the buffer layer 100 as shown in FIGS. 1 to 6, if the void 600 is formed between the buffer layer 100 and the first semiconductor layer 210, it may be difficult for the body 200 to epitaxially grow. Therefore, when the scattering pattern 400 is positioned so that the buffer layer 100 does not directly contact the first semiconductor layer 210 as shown in FIGS. 7 and 8, the light emitting devices 20 and 30 may include the void 600 between the scattering pattern 400 and the first semiconductor layer 210. That is, in the case of the light emitting device 10 according to the example embodiment of FIGS. 1 to 5, the conditions for epitaxial growth may be appropriately selected so that the void 600 may not be formed between the buffer layer 100 and the first semiconductor layer 210.

FIGS. 9A to 9D illustrate a method of manufacturing the light emitting device 10 according to an example embodiment through an etching process.

Figure 9A:
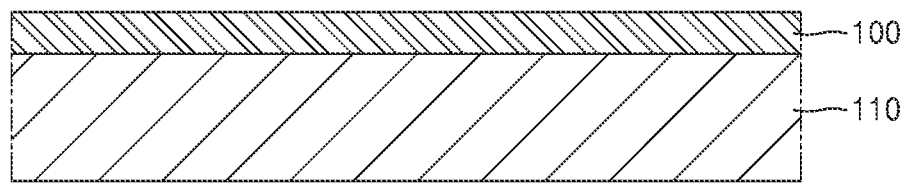
FIGS. 9A, 9B, 9C, and 9D illustrate a method of manufacturing a light emitting device by an etching process according to an example embodiment.

Referring to FIG. 9A, the buffer layer 100 may be grown on a substrate 110. The substrate 110 may include an organic material such as silicon (Si), glass, sapphire, or a polymer. The buffer layer 100 may include a material having the same crystal structure as that of a layer to be grown on the buffer layer 100. For example, in order to epitaxially grow the body 200 including gallium nitride (GaN) having a hexagonal wurtzite crystal structure on the buffer layer 100, the buffer layer 100 may include aluminum nitride (AlN) having the hexagonal wurtzite crystal structure. The buffer layer 100 may be grown in a flat shape over the entire upper region of the substrate 110.

Figure 9B:
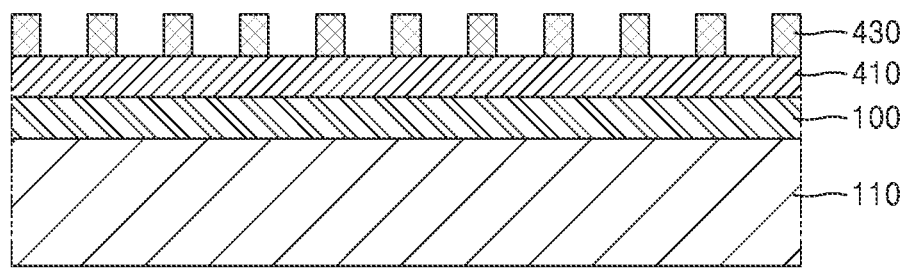

Referring to FIG. 9B, a scattering material layer 410 is deposited on the buffer layer 100, and a pattern is formed on the scattering material layer 410 using a photoresist. Here, the scattering material may be a material included in the scattering pattern 400, and the scattering material layer 410 may be a layer formed by depositing the scattering material on the entire upper surface of the buffer layer 100. For the deposition, various methods such as physical vapor deposition (PVD), chemical vapor deposition (CVD), and atomic layer deposition (ALD) may be used. A photoresist pattern 430 may be applied in a shape corresponding to a shape of the scattering pattern 400 to be formed. Forming the photoresist pattern 430 may include exposing and developing operation. After the photoresist is entirely applied to the scattering material layer 410 in the exposing and developing operation, light is radiated when a portion excluding a predetermined pattern shape is covered with a mask and the photoresist to which light is radiated is cured. Here, the portion not irradiated with light may melt. For example, a mask having a rectangular pattern may be used to form the scattering pattern 400 having a stripe shape. As another example, a plurality of circular masks may be used to form the scattering pattern 400 having a mesh structure including a plurality of circular cross-sectional holes. A structure, period, or thickness of the scattering pattern 400 may be appropriately selected considering light extraction efficiency and the like.

Figure 9C:
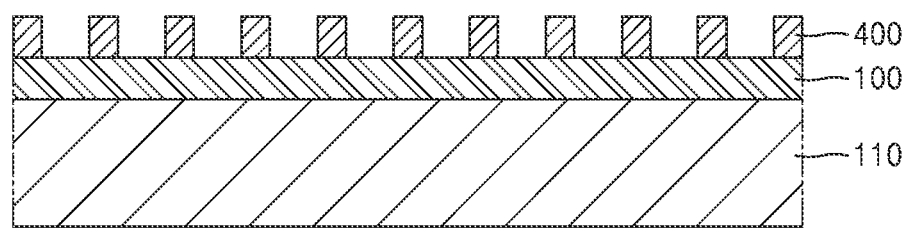

Referring to FIG. 9C, a portion of the scattering material layer 410 not covered with the photoresist may be dry etched, and the photoresist pattern 430 may be removed using an organic solvent such as acetone to form the scattering pattern 400 having a certain shape on the buffer layer 100.

Figure 9D:
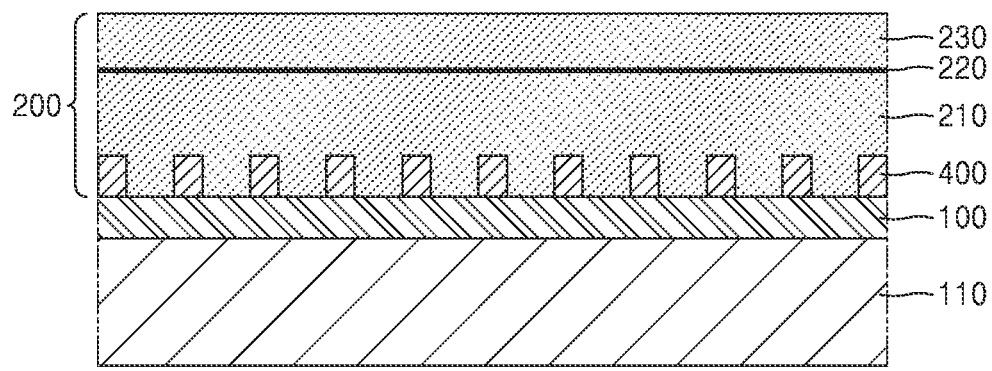

Referring to FIG. 9D, the body 200 is epitaxially grown on the buffer layer 100 on which the scattering pattern 400 is formed. Epitaxial growth conditions may be appropriately selected according to the structure, period, or thickness of the scattering pattern 400. As a light emitting structure grows, the scattering pattern 400 may be embedded in the first semiconductor layer 210.

After the above processes, the reflective layer 300 may be formed on the body 200, and the substrate 110 may be removed. However, embodiments are not limited to removing the substrate 110 after the reflective layer 300 is formed, and the substrate 110 may be removed before the reflective layer 300 is formed. The substrate 110 may be removed using a potassium hydroxide (KOH) wet etching process.

The processes of FIGS. 9A to 9D represent forming the scattering pattern 400 embedded in the first semiconductor layer 210 and positioned in contact with the buffer layer 100 on the buffer layer 100, but embodiments are not limited thereto and the scattering pattern 400 may be formed such that all the surfaces thereof are embedded in the first semiconductor layer 210. To this end, after the buffer layer 100 of FIG. 9A is formed, a portion of the first semiconductor layer 210 may be epitaxially grown on the buffer layer 100 first. Thereafter, the processes corresponding to FIGS. 9B and 9C may be performed on a portion of the first semiconductor layer 210, and the body 200 including the other portions of the first semiconductor layer 210 may be epitaxially grown on the first semiconductor layer 210 in which the scattering pattern 400 is formed in a process corresponding to FIG. 9D. These processes have been described in detail above, and thus, repeated descriptions thereof are omitted.

FIGS. 10A to 10D illustrate a method of manufacturing the light emitting device 30 according to another example embodiment.

The buffer layer 100 may be formed on the substrate 110. This may be the same as the formation of the buffer layer 100 described above with reference to FIG. 9A, and a detailed description thereof is omitted.

Figure 10A:
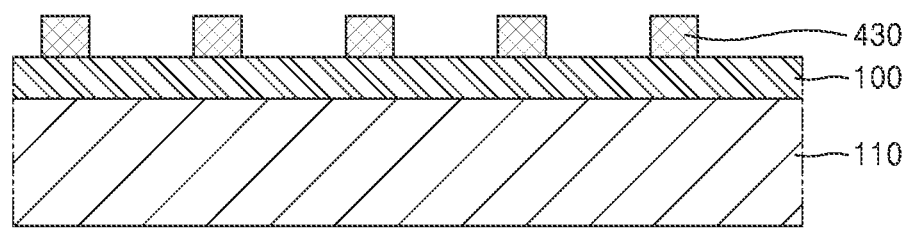
FIGS. 10A, 10B, 10C, and 10D illustrate a method of manufacturing a light emitting device according to another example embodiment.

Referring to FIG. 10A, the photoresist pattern 430 is formed on the buffer layer 100. The photoresist pattern 430 may be surrounded by the scattering pattern 400 to form the cavity 500 in a follow-up process.

Figure 10B:
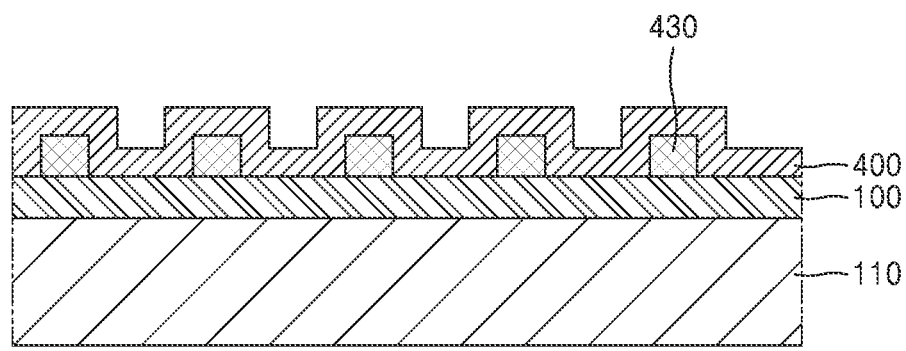

Referring to FIG. 10B, the scattering pattern 400 is deposited on the buffer layer 100 on which the photoresist pattern 430 is formed. Here, low-temperature ALD may be used as a method of depositing the scattering pattern 400. For example, for ALD of the scattering pattern 400 including aluminum oxide ($Al_2O_3$), $Al_2(CH_3)_3$ may be used as a precursor and $H_2O$ may be used as a reactant. Because a single atomic layer thin film is deposited through ALD, the scattering pattern 400 may be formed to be relatively thin. When the scattering pattern 400 is deposited as a single atomic layer thin film, the scattering pattern 400 may have the same pattern as the photoresist pattern 430.

Figure 10C:
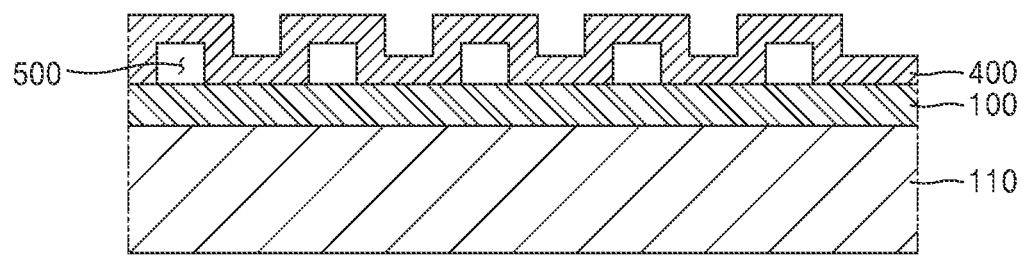

Referring to FIG. 10C, the photoresist pattern 430 is removed. The photoresist may be sufficiently removed through an organic solvent such as acetone, thereby forming the cavity 500 containing air. Here, the removal of the photoresist may be performed by partially etching the scattering pattern 400 or may be performed without partial etching. When the photoresist is removed, a portion containing air between the scattering pattern 400 and the buffer layer 100 may form the cavity 500. When the cavity 500 is formed, scattering may take place more easily, and thus, light extraction efficiency may be increased. After the photoresist is removed, annealing may be additionally performed. By increasing the crystallinity of the scattering pattern 400 through the annealing, the scattering pattern 400 may have the same lattice structure as the buffer layer 100. For example, the scattering pattern 400 may include a crystallized material. When crystallinity is secured by changing the structure of the scattering pattern 400 from amorphous to crystalline, it may be easy to epitaxially grow the body 200 on a flat upper portion of the scattering pattern 400. For example, to epitaxially grow gallium nitride (GaN) having a hexagonal wurtzite crystal structure, the scattering pattern 400 may be annealed on aluminum nitride (AlN) having the same crystal structure.

Figure 10D:
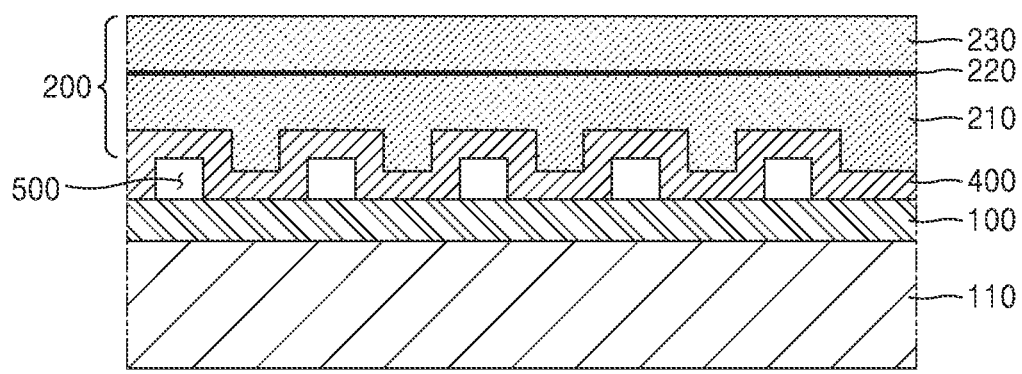

Referring to FIG. 10D, the body 200 is epitaxially grown on the scattering pattern 400 that has undergone the annealing. The scattering pattern 400 may include a first surface formed on the cavity 500 and a second surface directly contacting the buffer layer 100 and formed on the buffer layer 100. Here, although the first semiconductor layer 210 may be epitaxially grown on the first and second surfaces of the scattering pattern 400, the void, which is an empty space where epitaxial growth has not occurred, may be formed on the second surface thereof. The void contains air and may function similar to the cavity 500. When the void is formed, scattering may take place more easily, and thus, light extraction efficiency may be increased. Here, growth conditions may be appropriately selected so that the void is easily formed.

After the above steps, the reflective layer 300 may be formed on the body 200, and the substrate 110 may be removed. This is the same as that described above with respect to FIG. 9D, and thus, a detailed description thereof is omitted.

Figure 11A:
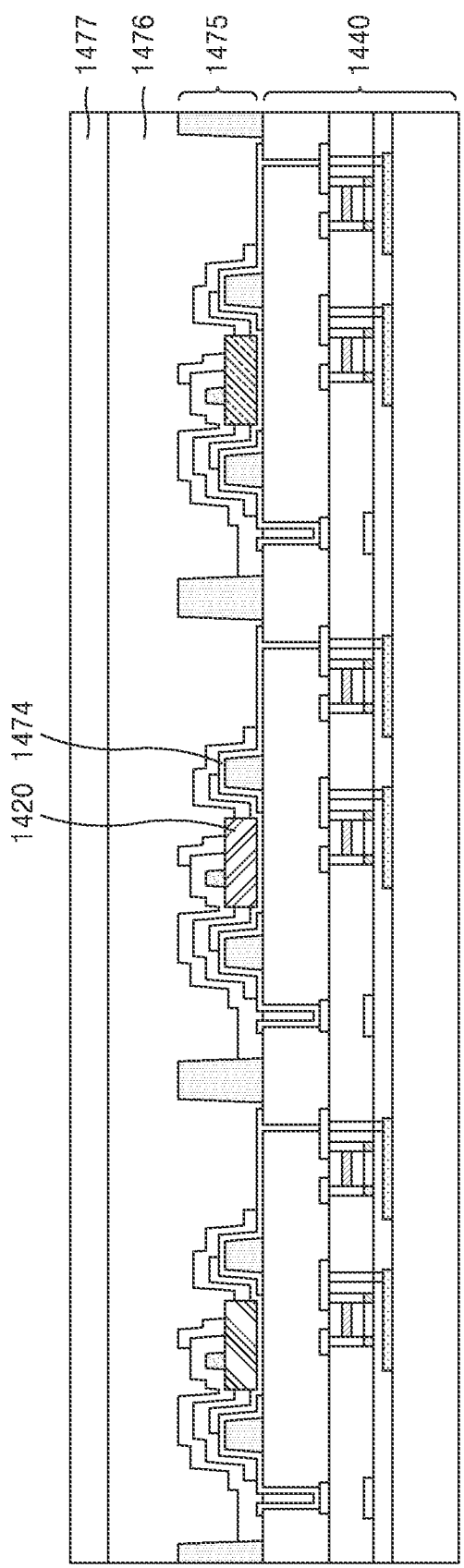
FIG. 11A is a view illustrating a display including a light emitting device according to an example embodiment.
Figure 11B:
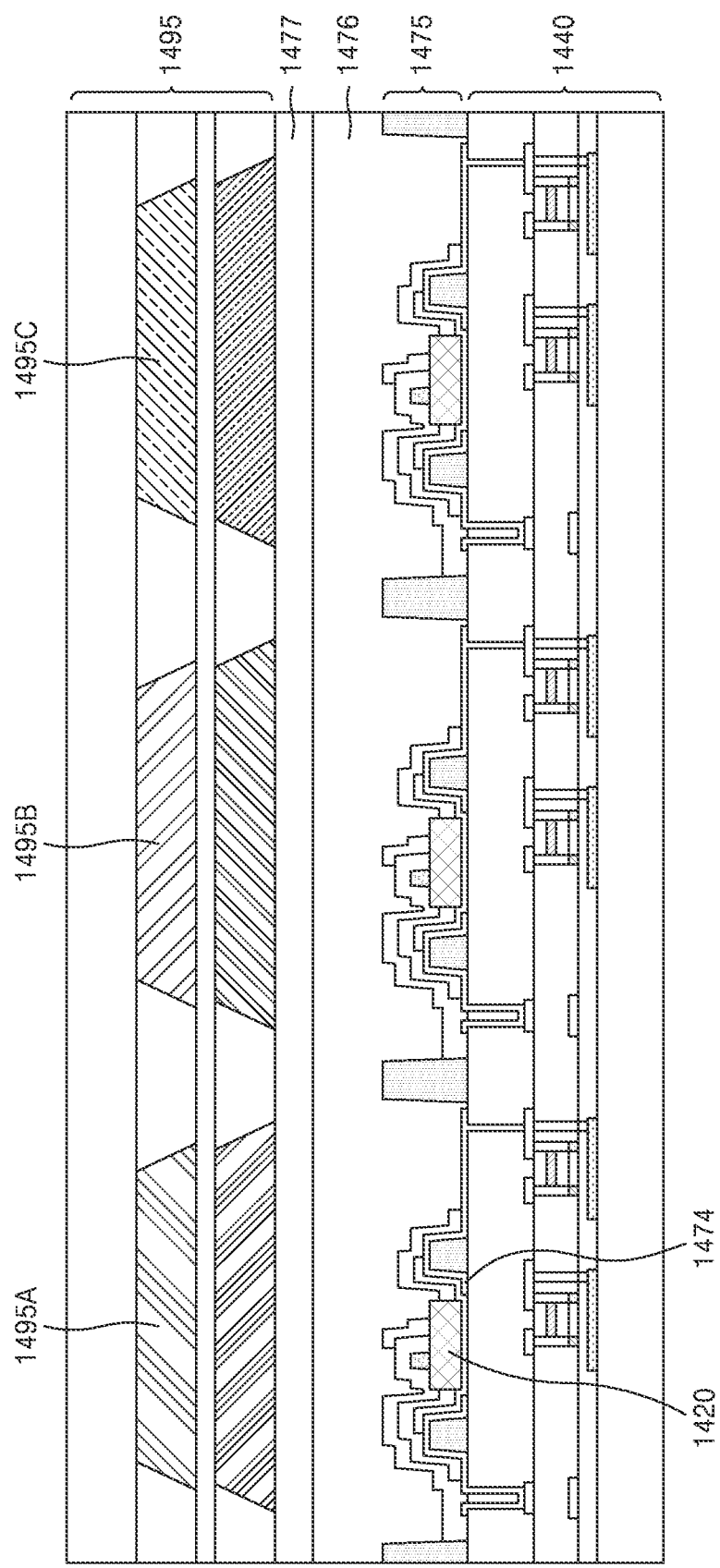
FIG. 11B is a view illustrating that a display including a light emitting device according to an example embodiment further including a color conversion layer.

FIG. 11A is a view illustrating a display device 1400 including a plurality of light emitting devices 1420 according to an example embodiment, and FIG. 11B is a view illustrating that the display device 1400 including the light emitting device 1420 according to an example embodiment further includes a color conversion layer 1495.

Referring to FIGS. 11A and 11B, the display device 1400 according to an example embodiment may include a display layer 1475 including the light emitting devices 1420 (including a micro light emitting device) and a driving layer 1440 including a plurality of transistors electrically connected to the light emitting devices 1420 and driving the light emitting devices 1420. Here, the light emitting device 1420 may be the light emitting devices 10, 20, and 30 described above with reference to FIGS. 1 to 10D. The light emitting device 1420 may be transferred to and fixed on the driving layer 1440 of the display device 1400 to form a pixel. When the light emitting device 1420 is transferred to the driving layer 1440, the light emitting device 1420 may be electrically connected to the transistor, and the light emitting device 1420 may be operated according to a signal from the transistor. For connection with the transistor, the reflective layer 300 may be used as a first electrode, and the body of the light emitting device 1420 may be partially etched to form a second electrode on the first semiconductor layer. The display layer 1475 including the light emitting device 1420 may be passivated. In order for the display to implement full colors, an RGB display method in which each of the light emitting devices 1420 emitting red R, green G, and blue B is transferred to and fixed in one pixel may be used. According to another example embodiment, a method using color conversion layers in which the light emitting devices 1420 emitting blue B are transferred and fixed in one pixel and the color conversion layers 1495 are formed on the light emitting devices 1420 may be used. FIG. 11A shows that the light emitting devices 1420 emitting different colors of R, G, and B are transferred into one pixel, and FIG. 11B shows that the light emitting devices 1420 emitting blue B are transferred into one pixel and the color conversion layer 1495 is positioned on the display layer 1475. The color conversion layer 1495 may include a first color conversion layer 1495A converting light from the micro LED 1420 into a first color, a second color conversion layer 1495B converting light into a second color, and a third color conversion layer 1495C converting light into a third color. For example, the first color may be red light, the second color may be green light, and the third color may be blue light. When the micro LED 1420 emits blue light, the first color conversion layer 1495A may convert blue light into red light, the second color conversion layer 1495B may convert blue light into green light, and the third color conversion layer 1495C may be a layer including a resin transmitting blue light so that there is no color conversion.

The display device including the light emitting devices 10, 20, and 30 described above with reference to FIGS. 1 to 10D may be used in various electronic devices.

Figure 12:
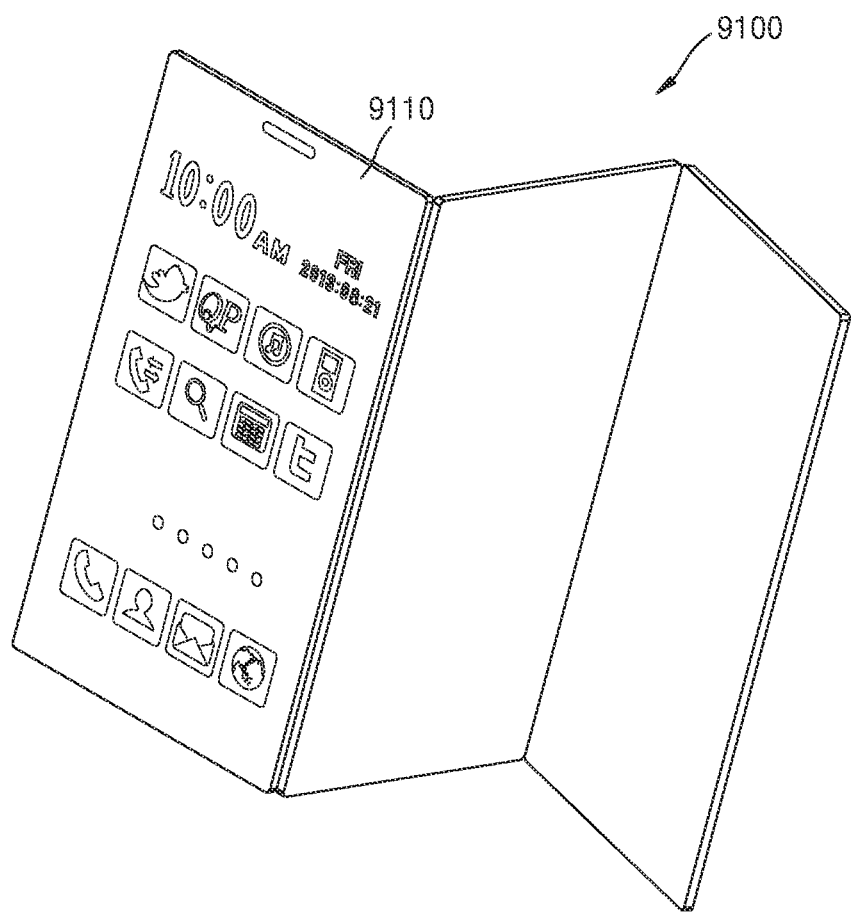
FIG. 12 illustrates an example in which a display device according to an example embodiment is applied to a mobile device.

FIG. 12 illustrates an example in which the display device according to an example embodiment is applied to a mobile device 9100. The mobile device 9100 may include a display device 9110 according to an example embodiment. The display device 9110 may include the light emitting devices 10, 20, and 30 described above with reference to FIGS. 1 to 10D. The display device 9110 may have a foldable structure and may be applied to, for example, a multi-folder display. Here, although the mobile device 9100 is illustrated as a folder-type display, the mobile device 9100 may also be applied to a general flat panel display.

Figure 13:
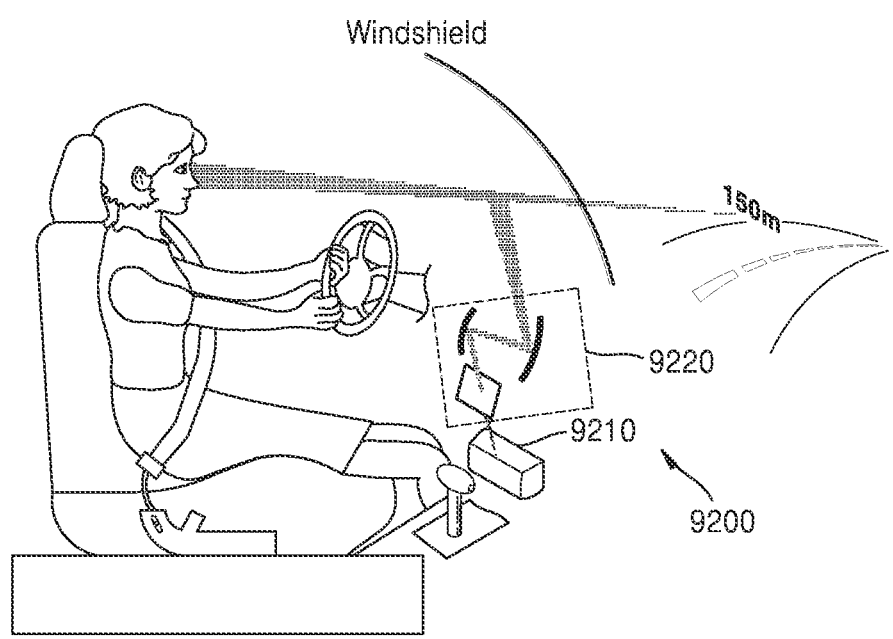
FIG. 13 illustrates an example in which a display device according to an example embodiment is applied to a vehicle.

FIG. 13 illustrates an example in which a display device according to an example embodiment is applied to a vehicle. The display device may be applied to a head-up display device 9200 for a vehicle. The head-up display device 9200 may include a display device 9210 provided in a region of the vehicle and at least one light path changing member 9220 changing a path of light so that a driver may see an image generated by the display device 9210.

Figure 14:
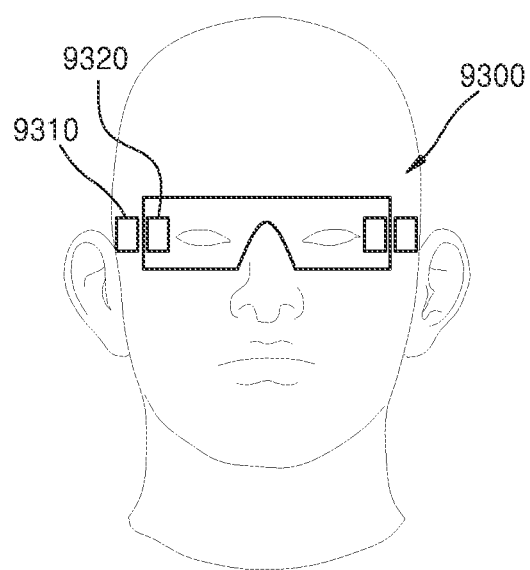
FIG. 14 illustrates an example in which a display device according to an example embodiment is applied to augmented reality (AR) glasses or virtual reality (VR) glasses.

FIG. 14 illustrates an example in which a display device is applied to augmented reality (AR) glasses 9300 or virtual reality (VR) glasses according to an example embodiment. The AR glasses 9300 may include a projection system 9310 forming an image and at least one element 9320 guiding the image from the projection system 9310 to a user's eye. The projection system 9310 may include the light emitting devices 10, 20, and 30 described above with reference to FIGS. 1 to 10D.

Figure 15:
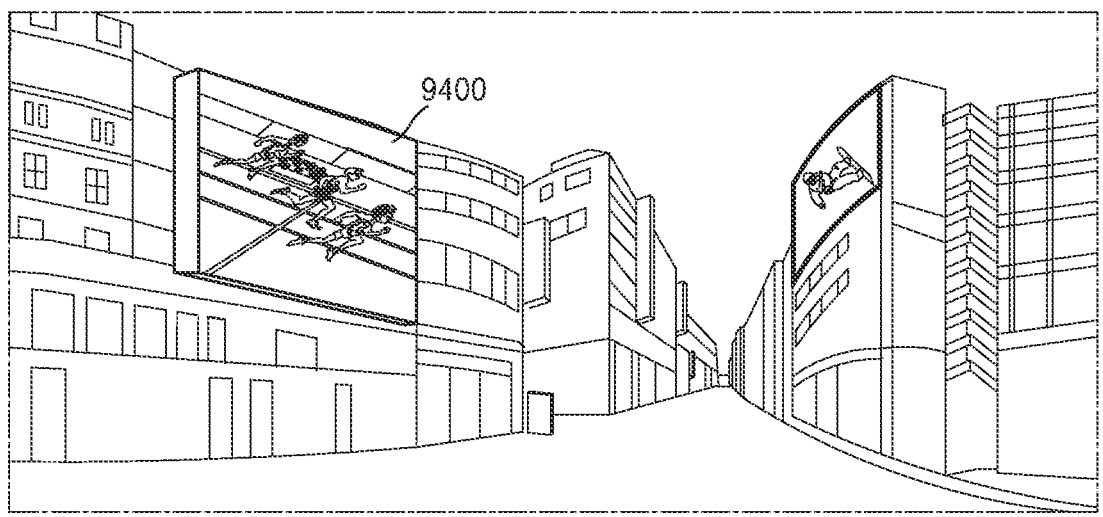
FIG. 15 is a view illustrating an example in which a display device according to an example embodiment is applied to a large signage.

FIG. 15 is a view illustrating an example in which a display device according to an example embodiment is applied to a large signage 9400. The signage 9400 may be used for outdoor advertisements using a digital information display and may control advertisement content and the like through a communication network.

Figure 16:
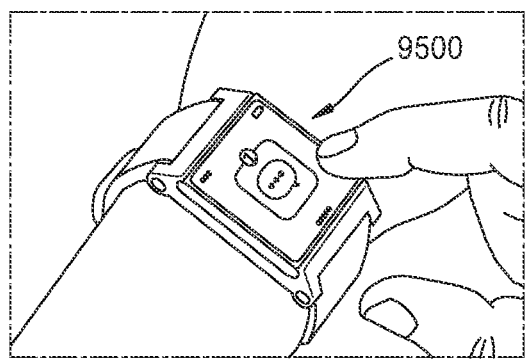
FIG. 16 illustrates an example in which a display device according to an example embodiment is applied to a wearable display.

FIG. 16 illustrates an example in which a display device according to an example embodiment is applied to a wearable display 9500. The wearable display 9500 may include the light emitting devices 10, 20, and 30 described above with reference to FIGS. 1 to 10D.

The display device according to an example embodiment may be applied to LED TVs, liquid crystal displays, mobile displays, smart watches, AR glasses, VR glasses, heads-up displays, or signages. In addition, the display device may be applied to various products such as rollable TVs and stretchable displays.

According to the example embodiments described above, the scattering pattern is embedded in the first semiconductor layer, so that light emitted from the active layer is scattered by the scattering pattern and thus escapes out of the light emitting device. Therefore, the light emitting device having high light extraction efficiency due to the scattering pattern may be provided.

In addition, because the reflective layer is positioned on an upper portion of the body, light emitted upward from the active layer may be reflected in a direction toward the scattering pattern, thereby improving light extraction efficiency of bottom emission.

The example embodiments described above may further include cavities between the scattering pattern and the buffer layer, and light extraction efficiency may be further improved by the cavities.

In addition, the example embodiments described above may further include a void between adjacent cavities, and thus, light extraction efficiency may be further improved by the void.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A light emitting device comprising:
a buffer layer;
a body provided on the buffer layer, the body comprising a first semiconductor layer, an active layer, and a second semiconductor layer;
a reflective layer configured to reflect light incident from the active layer;
a scattering pattern provided in the first semiconductor layer, the scattering pattern being configured to scatter the light incident from the active layer and light incident from the reflective layer; and
a plurality of cavities contacting the scattering pattern and the buffer layer, the cavities containing air,
wherein the reflective layer is provided on an entire upper surface of the second semiconductor layer and configured to reflect the light emitted upward from the active layer downward, and
wherein a refractive index of the scattering pattern is lower than a refractive index of the first semiconductor layer.

2. The light emitting device of claim 1,
wherein at least one side of the scattering pattern is direct contact with the buffer layer, and the other sides of the scattering pattern are direct contact with the first semiconductor layer.

3. The light emitting device of claim 1, wherein the scattering pattern includes a dielectric material having a permittivity of 4 or less.

4. The light emitting device of claim 1, wherein the scattering pattern includes at least one of aluminum oxide ($Al_2O_3$), silicon oxide ($SiO_2$), silicon nitride ($Si_3N_4$), titanium oxide ($TiO_2$), magnesium oxide (MgO), magnesium fluoride ($MgF_2$), stannic oxide ($SnO_2$), tantalum dioxide ($TaO_2$), zinc sulfide (ZnS), or ceric oxide ($CeO_2$).

5. The light emitting device of claim 1, wherein a thickness of the scattering pattern is 10 nm to 1 μm.

6. The light emitting device of claim 1, wherein the scattering pattern includes a crystallized material.

7. The light emitting device of claim 1, wherein one of the first semiconductor layer and the second semiconductor layer is a p-type semiconductor layer, and the other of the first semiconductor layer and the second semiconductor layer is an n-type semiconductor layer.

8. The light emitting device of claim 1, wherein the active layer has a multi-quantum well (MQW) structure, and
wherein the active layer includes a quantum barrier layer comprising gallium nitride (GaN) and a quantum well layer comprising $In_xGa_{1-x}N$ ($0 \leq x \leq 1$).

9. The light emitting device of claim 1, wherein the reflective layer includes at least one of gold (Au), silver (Ag), or aluminum (Al).

10. The light emitting device of claim 1, wherein the buffer layer includes aluminum nitride (AlN).

11. A display device comprising:
- a display layer comprising a plurality of light emitting devices; and
- a driving layer comprising a plurality of transistors electrically connected to the plurality of light emitting devices, respectively, and the driving layer being configured to drive the plurality of light emitting devices,
wherein at least one of the plurality of light emitting devices comprises:
- a buffer layer;
- a body provided on the buffer layer, the body comprising a first semiconductor layer, an active layer, and a second semiconductor layer;
- a reflective layer configured to reflect light incident from the active layer;
- a scattering pattern is provided in the first semiconductor layer, the scattering pattern being configured to scatter the light incident from the active layer and light reflected from the reflective layer; and
- a plurality of cavities contacting the scattering pattern and the buffer layer, the cavities containing air,
wherein the reflective layer is provided on an entire upper surface of the second semiconductor layer and configured to reflect the light emitted upward from the active layer downward, and
wherein a refractive index of the scattering pattern is lower than a refractive index of the first semiconductor layer.

* * * * *